US010810070B2

(12) United States Patent
Walton et al.

(10) Patent No.: US 10,810,070 B2
(45) Date of Patent: Oct. 20, 2020

(54) SIMULATOR BASED DETECTION OF A VIOLATION OF A COHERENCY PROTOCOL IN AN INCOHERENT SHARED MEMORY SYSTEM

(71) Applicant: Hewlett Packard Enterprise Development LP, Houston, TX (US)

(72) Inventors: Andrew C. Walton, Rocklin, CA (US); Charles Stuart Johnson, San Jose, CA (US); Alexander V. Jizrawi, Folsom, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 133 days.

(21) Appl. No.: 16/073,066

(22) PCT Filed: Feb. 19, 2016

(86) PCT No.: PCT/US2016/018614
§ 371 (c)(1),
(2) Date: Jul. 26, 2018

(87) PCT Pub. No.: WO2017/142547
PCT Pub. Date: Aug. 24, 2017

(65) Prior Publication Data
US 2019/0042341 A1    Feb. 7, 2019

(51) Int. Cl.
*G06F 11/00* (2006.01)
*G06F 11/07* (2006.01)
(Continued)

(52) U.S. Cl.
CPC ............ *G06F 11/073* (2013.01); *G06F 11/00* (2013.01); *G06F 11/0751* (2013.01);
(Continued)

(58) Field of Classification Search
CPC ............ G06F 12/0815; G06F 12/0837; G06F 12/084; G06F 12/0891; G06F 11/073; G06F 11/0751; G06F 11/261; G06F 11/362
See application file for complete search history.

(56) References Cited

U.S. PATENT DOCUMENTS 6,263,302 B1 * 7/2001 Hellestrand ............. G06F 9/455
703/17
9,189,413 B2   11/2015 McKenney
(Continued)

FOREIGN PATENT DOCUMENTS

WO    WO-2012042077        4/2012

OTHER PUBLICATIONS

International Search Report & Written Opinion received in PCT Application No. PCT/US2016/018614, dated Nov. 11, 2016, 13 pages.
(Continued)

*Primary Examiner* — Michael Maskulinski
(74) *Attorney, Agent, or Firm* — Hewlett Packard Enterprise Patent Department

(57) ABSTRACT

Simulator based detection of a violation of a coherency protocol in an incoherent shared memory system is disclosed. One example is a system including a simulator running on a first computing system, where the simulator simulates a second computing system that is a target for an application to be tested, and where the simulator includes a cache manager to monitor a state of a plurality of simulated caches in an incoherent memory system shared by a plurality of simulated processors, wherein the plurality of simulated processors simulate operations of a respective plurality of processors of the second computing system, and detect a violation of a coherency protocol in the shared memory system, and an alert generator to provide, via a computing
(Continued)

device on the first computing system, an alert indicative of the violation.

15 Claims, 3 Drawing Sheets

(51) Int. Cl.
G06F 30/33 (2020.01)
G06F 12/0804 (2016.01)
G06F 12/0815 (2016.01)
G06F 12/084 (2016.01)

(52) U.S. Cl.
CPC ........ *G06F 12/0804* (2013.01); *G06F 12/084* (2013.01); *G06F 12/0815* (2013.01); *G06F 30/33* (2020.01); *G06F 2212/1048* (2013.01)

(56) References Cited

U.S. PATENT DOCUMENTS

| | | | |
|---|---|---|---|
| 9,195,531 B2 | 11/2015 | Loewenstein et al. | |
| 10,417,128 B2 * | 9/2019 | Di Blas | G06F 12/0833 |
| 2004/0210721 A1 | 10/2004 | Detjens et al. | |
| 2006/0277371 A1 | 12/2006 | Cohn et al. | |
| 2009/0063780 A1 | 3/2009 | Terechko et al. | |
| 2009/0276578 A1 | 11/2009 | Moyer | |
| 2010/0175051 A1 | 7/2010 | Tanabe et al. | |
| 2014/0236561 A1 | 8/2014 | Dusanapudi et al. | |
| 2014/0258635 A1 * | 9/2014 | Hong | G06F 12/0891 711/133 |
| 2014/0258637 A1 * | 9/2014 | Hong | G06F 12/0808 711/135 |
| 2016/0034398 A1 | 2/2016 | Wendel et al. | |
| 2017/0220437 A1 * | 8/2017 | Habermann | G06F 12/0808 |
| 2018/0307601 A1 * | 10/2018 | Sherlock | G06F 12/0804 |

OTHER PUBLICATIONS

Kelm J. et al., "SChISM: Scalable Cache Incoherent Shared Memory" Aug. 2008.

* cited by examiner

SIMULATOR BASED DETECTION OF A VIOLATION OF A COHERENCY PROTOCOL IN AN INCOHERENT SHARED MEMORY SYSTEM

BACKGROUND

Multi-processor computers generally utilize cache-coherent memory to provide processors a consistent view of shared memory contents. Read and/or write operations may be executed on the shared memory contents by a plurality of processors.

DETAILED DESCRIPTION

Figure 1:
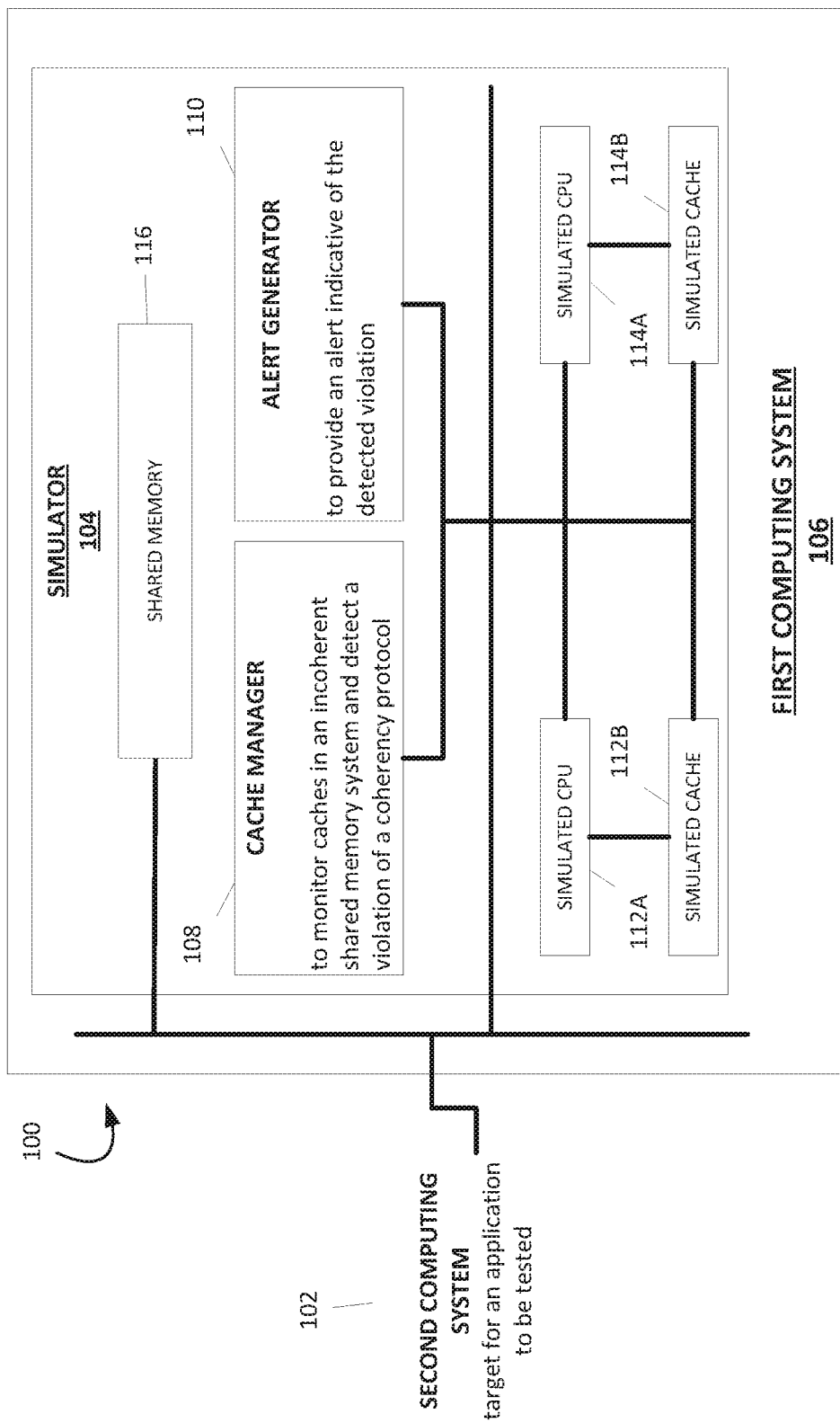
FIG. 1 is a functional block diagram illustrating one example of a system for a simulator based detection of a violation of a coherency protocol in an incoherent shared memory system.

Shared memory systems are widely utilized in multiprocessing environments where two or more processors work simultaneously. The shared memory system may include a hard disk, memory, and/or memory devices. Instructions and/or data that are frequently accessed, updated, and/or stored, are generally stored in a cache memory which enables short access times for such frequently utilized instructions and/or data. Caches offer several advantages including, for example, reduced average access times, and reduced demands on network bandwidth. As cache memories are generally volatile, they are also reusable, and do not occupy storage space.

However, given that caches are simultaneously accessed by a plurality of processors, there may be cache coherence issues. For example, a processor may read a cache line that has been recently updated by another processor. Generally, computing devices that utilize more than one processor may include hardware to enable coherent memory accesses, so that a processor that reads memory can see changes to that memory from another processor, even if the new value for the memory is still in the writing processor's cache. For example, multi-processor computers may use hardware based techniques such as snooping and directory tags to keep memory consistent between processors. Such hardware based techniques may have scaling limits.

Many computer systems scale beyond limits of hardware based coherency techniques. In such systems, software based techniques may be utilized to maintain coherency by, for example, cooperatively flushing and invalidating caches. Such large scaled systems may generally be referred to as cache incoherent systems. In some examples, cache incoherent systems may be partially coherent. For example, clusters of processors may be cache coherent, but accesses to memory that is shared between clusters may not be coherent.

When software writes to an address in a cache incoherent system, it needs to ensure that it has sole ownership of the address. This may generally be achieved by a concurrency protocol so that another processor is not able to write it simultaneously. Since the system is cache incoherent, the software may need to flush modified cache lines after a data write operation, especially if another processor is likely to access the data, or if the data is to be persistent in case of a potential failure. Many software developers are likely continue to rely on assumptions from their experience using cache coherent systems, where hardware retrieves dirty cache lines from the writing processor and delivers it to the processor that read the cache line's address. Accordingly, when a write operation is not flushed by software, the cache line may be in an indeterminate state. It might have been demand evicted from the cache, or may still be in the cache when another processor attempts to read the incoherent memory. If the software running on an cache incoherent system failed to flush the data, but the data was demand evicted, it might appear that the software is working correctly. However, if memory access patterns change such that the dirty cache lines data do not get evicted, the dirty cache lines will not be written to memory and software reading the cache lines will get stale data.

As another example, a first processor that reads data in a memory location in a cache incoherent system may be generally unaware that another processor has written the data being read in the memory location. As a result, the first processor may have stale data in its cache. Accordingly, before reading data that another processor might have written, the cache lines associated with the first processor must be invalidated to prevent a read operation on stale cache data. Software development strategies based on cache coherent systems generally do not account for such cache invalidation. As a result, existing techniques for cache incoherent systems are generally not designed to invalidate the stale cache. Such an error may be difficult to detect since the stale cache lines may be demand invalidated prior to a first read of a particular address by the first processor, but not subsequently (e.g., prior to a second read, a third read, and so forth), until there is an eviction event.

Generally, solutions designed for cache coherent systems, such as, for example, debuggers, existing code instrumentation tools, and so forth, are hardware specific. Debugging software when it is running on hardware is not a deterministic process. For example, a race condition may occur whenever two or more processors attempt to access a shared memory system simultaneously. Accordingly, when software is run on a hardware device, each run of the software may produce a different result based on how the race conditions are satisfied each time. As a result, it may be difficult to debug software that is being run on a hardware device. Also, for example, there may be errors due to unknown and/or variable outcomes of race conditions, leading to errors in debugging of software code, especially for unpredictable demand evictions and/or demand invalidations.

As described herein, errors in debugging software may be minimized by running the software on a simulator designed to detect software bugs in code written for parallel computing devices that share an incoherent memory system. Such a simulator may also minimize problems that arise from scaling limits of hardware based coherency techniques. The simulator runs the software code and tracks cache state to detect bugs in the code. For example, the simulator may be designed to detect bugs that are caused by an improper handling of cache flushes, and/or invalidations in a cache incoherent system.

As described in various examples herein, a simulator based detection of a violation of a coherency protocol in an incoherent shared memory system is disclosed. One example is a system including a simulator running on a first computing system, where the simulator simulates a second computing system that is a target for an application to be tested, and where the simulator includes a cache manager to monitor a state of a plurality of simulated caches in an incoherent memory system shared by a plurality of simulated processors, wherein the plurality of simulated processors simulate operations of a respective plurality of processors of the second computing system, and detect a violation of a coherency protocol in the shared memory system, and an alert generator to provide, via a computing device on the first computing system, an alert indicative of the violation.

In the following detailed description, reference is made to the accompanying drawings which form a part hereof, and in which is shown by way of illustration specific examples in which the disclosure may be practiced. It is to be understood that other examples may be utilized, and structural or logical changes may be made without departing from the scope of the present disclosure. The following detailed description, therefore, is not to be taken in a limiting sense, and the scope of the present disclosure is defined by the appended claims. It is to be understood that features of the various examples described herein may be combined, in part or whole, with each other, unless specifically noted otherwise.

FIG. 1 is a functional block diagram illustrating one example of a system for a simulator based detection of a violation of a coherency protocol in an incoherent shared memory system. System 100 includes a simulator 104 running on a first computing system 106, where the simulator 104 is to simulate a second computing system 102 that is a target for an application to be tested. Generally, the simulator 104 is run on the first computing system 106, and includes code for simulating the second computing system 102 to which the application under test is targeted. The application under test is generally run unmodified on the simulated processors, for example, simulated CPU 112A and simulated CPU 114A, simulated caches, for example, simulated cache 112B and simulated cache 114B, and shared memory 116. The simulation may be a parallel application that runs on a distributed system or it may be a monolithic application that runs on a traditional computer. The simulator 104 may simulate the entire second computing system 102 on which the application is to be tested, and may view a state of each of the caches and processors simultaneously.

In some examples, the simulator 104 may include a cache manager 108 to monitor a state of a plurality of simulated caches in an incoherent memory system shared by a plurality of simulated processors, where the plurality of simulated processors simulate operations of a respective plurality of processors of the second computing system 102, and detect a violation of a coherency protocol in the shared memory system 116. An incoherent memory system, as used herein, is any memory system that is a cache incoherent system. In some examples, the incoherent memory system may include a shared memory, shared by a plurality of processors and a plurality of caches. For example, the simulator 104 may simulate such an incoherent memory system that includes the shared memory 116, shared by the plurality of simulated processors (e.g., simulated CPU 112A, simulated CPU 114A) and the plurality of simulated caches (e.g., simulated cache 112B, simulated cache 114B).

The term "coherency protocol" may generally refer to a condition that maintains coherence among a plurality of caches that access a shared memory system. For example, the coherency protocol may include memory access management policies that manage access by a plurality of processors to a shared memory 116. In some examples, the coherency protocol may include performing operations that ensures flushing of a write operation, invalidating a stale cache, preventing a demand eviction, preventing a demand invalidation, and so forth.

In some examples, the violation of the coherency protocol may occur when a cache is not flushed subsequent to a write operation. For example, a first CPU (e.g., a CPU associated with simulated CPU 112A) may write a cache line and the dirty cache line may remain in the first CPU's cache (e.g., a cache associated with simulated cache 112B). A second CPU (e.g., a CPU associated with simulated CPU 114A) may read the address of the cache line and receive stale data from memory (since the new value written by the first CPU is still in the first CPU's cache and has not been flushed to memory 116).

In some examples, the violation of the coherency protocol may occur when a cache line's address is not invalidated prior to a read operation. For example, the first CPU (e.g., the CPU associated with simulated CPU 112A) may have accessed a cache line from memory 116 in the past, and the cache line may still remain in the first CPU's cache. The second CPU (e.g., the CPU associated with simulated CPU 114A) may have written a new value to the cache line's address in memory 116. The first CPU may attempt to read the cache line again, but fails invalidate the cache line's address before performing the read operation. Accordingly, the first CPU views the old value of the data in its cache and not the value written by the second CPU to memory 116.

As described herein, in some examples, modified cache lines may need to be flushed after a data write operation, especially if another processor is likely to access the data, or if the data is to be persistent in case of a potential failure. In some examples, the cache manager 108 may a track flush state for a simulated cache (e.g., simulated cache 112B, simulated cache 114B) associated with a simulated CPU (e.g., simulated CPU 112A, simulated CPU 114A, respectively) performing a write operation. Generally, the flush state is indicative of whether a cache line in a simulated cache is flushed or unflushed. In some examples, the cache manager 108 may track the flush state of a simulated cache at regular intervals. In some examples, cache manager 108 may track the flush state of a simulated cache at a time when the simulated cache is active in a read or write operation by an associated simulated processor. In some examples, the cache manager 108 may store the flush state for each simulated caches in a database, and may update such a database at regular intervals, and/or when the flush state is tracked.

In some examples, the cache manager 108 may track a cache invalidation in a simulated CPU that is performing a read operation in the incoherent memory system. As described herein, before reading data that another processor might have written, cache lines associated with the first processor must be invalidated to prevent a read operation on stale cache data. Software development strategies based on cache coherent systems generally do not account for such cache invalidation. As a result, existing techniques for cache incoherent systems are generally not designed to invalidate the stale cache. Such an error may be difficult to detect since the stale cache lines may be demand invalidated prior to a first read of a particular address by the first processor, but not subsequently (e.g., prior to a second read, a third read, and so forth), until there is an eviction event. However, the simulator 104 may track the cache invalidation in the simulated CPU that is performing a read operation, and identify a source of the error, for example, prior to an occurrence of a demand invalidation.

In some examples, the cache manager 108 may determine, for each of the plurality of simulated caches, if a software failed to flush a cache line so that software running on another processor is reading stale data. For example, the cache manager 108 may access the database to look up data associated with the flush state of simulated cache 112B, determine that a cache line in the simulated cache 112B is unflushed, determine that simulated processor 112A associated with the simulated cache 112B has modified the unflushed cache line, and that the same cache line in simulated cache 114B is being read by simulated processor 114A. Accordingly, the cache manager 108 may determine that the cache line in the simulated cache 112B needed to be flushed.

In some examples, upon a determination that the cache line needs to be flushed, the cache manager 108 may validate that the cache line is flushed. For example, the cache manager 108 may monitor the cache line in the simulated cache 112B to see if it is flushed. In some examples, the cache manager 108 may update a table entry in a database to record that the cache line in the simulated cache 112B is flushed. In some examples, such a validation may be included in the coherency protocol.

In some examples, the violation may be an occurrence of a write coherency violation. A write coherency violation occurs when a first simulated processor of the plurality of simulated processors reading a cache line in a first simulated cache of the plurality of simulated caches prior to a write operation, while a second simulated processor of the plurality of simulated processors is modifying the cache line in the second simulated cache, and the cache manager 108 may detect the violation by checking the state of the first simulated cache when the cache line is read by the first simulated processor. For example, cache manager 108 may monitor simulated CPU 112A and determine that it has read a cache line in simulated cache 112B for ownership (e.g., in preparation for writing it). Cache manager 108 may, for example, concurrently monitor simulated CPU 114A and determine that simulated CPU 114A has the same cache line modified and unflushed in its simulated cache 114B. Generally, the simulator 104 may be designed to run system routines that are performed every time a cache line is read for ownership by one processor (e.g., simulated CPU 112A) and detect that a violation of a coherency protocol with respect to the write operation has occurred from another processor (e.g., simulated CPU 114A).

Also, for example, cache manager 108 may monitor a first processor (e.g., simulated CPU 112A) and determine that it has performed a read operation on data in a memory location in the shared memory 116. Generally, the simulated CPU 112A may be unaware that another processor (e.g., simulated CPU 114A) has performed a write operation on the data being read in the same memory location in the shared memory 116. As a result, the simulated CPU 112A may have stale data in simulated cache 112B. Accordingly, before reading data that simulated CPU 114A might have written, the simulated cache 112B must be invalidated to prevent a read operation on stale cache data.

In some examples, the violation may be an invalid cache line in a simulated cache of the plurality of simulated caches, and the cache manager 108 may detect the violation by checking the state of the simulated cache when the invalid cache line is read by a simulated processor of the plurality of simulated processors. For example, cache manager 108 may monitor the simulated CPU 114A and determine that the simulated CPU 114A has written the data being read in the same memory location in the shared memory 116, and may detect a violation of a coherency protocol from the simulated CPU 114A.

In some examples, the violation may be a flush of a cache line by a second simulated processor subsequent to the cache line being read by a first simulated processor. For example, simulated CPU 114A may flush a cache line in simulated cache 114B subsequent to the cache line being read by simulated CPU 112A in simulated cache 112B. Accordingly, the cache manager 108 may detect the violation by identifying that the first simulated processor, simulated CPU 112A, is attempting to read the cache line when the cache line is flushed by the second simulated processor, simulated CPU 114A.

In some examples, the violation may be a false consistency in the shared memory 116. For example, when a cache controller in a CPU needs to create more storage capacity in its cache, the cache controller may generally demand evict existing cache lines by flushing dirty cache lines to memory and/or invalidating clean cache lines. Such a demand evict means that an application that forgets to flush and invalidate caches might sometimes work correctly depending on the memory access patterns of all of the applications running on that CPU. As described herein, in some examples, the simulator 104 may simulate a CPU cache controller that never demand evicts cache, and may therefore catch mistakes in the application that would be difficult to detect on hardware.

System 100 includes an alert generator 110 to provide, via a computing device on the first computing system 106, an alert indicative of the violation. For example, the alert generator 110 may provide an indication that a write coherency violation has occurred. Also, for example, the alert generator 110 may provide an indication of a presence of an invalid cache line in a simulated cache. As another example, the alert generator 110 may provide an indication of a flush of a cache line by a second simulated processor subsequent to the cache line being read by a first simulated processor. Also, for example, the alert generator 110 may provide an indication of a false consistency.

In some examples, the alert generator 110 may generate an alert to pause and/or stop the simulation. For example, the alert generator 110 may provide, via the computing device, an indication that a violation has been detected, and may recommend that the simulator 104 be paused and/or stopped so that the application may be debugged to rectify the violation. In some examples, the simulator 104 may track the particular locations in the source code that accessed the memory 116 incorrectly and inform the user exactly where the software coherency violation occurred.

System 100 may be implemented by a computing device. As used herein, a computing device may be a desktop computer, laptop (or notebook) computer, workstation, tablet computer, mobile phone, smart device, switch, router, server, blade enclosure, or any other processing device or equipment including a processing resource. In examples described herein, a processing resource may include, for example, one processor or multiple processors included in a single computing device or distributed across multiple computing devices. The components of system 100 (e.g., 104, 108, and 110, and so forth) may be any combination of hardware and programming to implement the functionalities described herein. In examples described herein, such combinations of hardware and programming may be implemented in a number of different ways. For example, the programming for the components may be processor executable instructions stored on at least one non-transitory machine-readable storage medium and the hardware for the components may include at least one processing resource to execute those instructions. In some examples, the hardware may also include other electronic circuitry to at least partially implement at least one component of system 100. In some examples, the at least one machine-readable storage medium may store instructions that, when executed by the at least one processing resource, at least partially implement some or all of components 104, 108, and 110 of system 100. In such examples, system 100 may include the at least one machine-readable storage medium storing the instructions and the at least one processing resource to execute the instructions. In other examples, the functionalities of any components of system 100 may be at least partially implemented in the form of electronic circuitry.

For example, the simulator 104 may be a combination of hardware and programming (e.g., processor executable instructions) running on the first computing system 106. For example, the programming of simulator 104 may include instructions executable to simulate the second computing system 102 that is a target for an application to be tested. Also, for example, the simulator 104 may include hardware to physically store, for example, data for flush states for cache lines, a log of read and write operations by the plurality of processors, and so forth. As another example, the programming of simulator 104 may implement functionality to interact with the second computing system 102 to determine parameters for the plurality of processors and the plurality of caches that are to be simulated. Also, for example, the simulator 104 may include a combination of hardware and software programming to dynamically interact with the other components of system 100.

Likewise, the cache manager 108 may be a combination of hardware and programming (e.g., processor executable instructions) to monitor a state of a plurality of simulated caches in an incoherent memory system shared by a plurality of simulated processors. For example, the programming of cache manager 108 may include instructions executable to automatically track the state of each cache line in each cache. Also, for example, cache manager 108 may include hardware to physically store, for example, instructions to store tracking data, flush state data, read and/or write operation data in a database. The cache manager 108 may include a combination of hardware and software programming to dynamically interact with the other components of system 100.

Also, for example, the alert generator 110 may be a combination of hardware and programming (e.g., processor executable instructions) to provide, via the computing device on the first computing system 106, an alert indicative of a detected violation. For example, the programming of alert generator 110 may include instructions executable to provide an indication to pause, and/or atop the simulator 104. The alert generator 110 may include a combination of hardware and software programming to dynamically interact with the other components of system 100.

Generally, as described herein, the components of system 100 may include software programming and physical networks to be communicatively linked to other components of system 100. In some instances, the components of system 100 may include a processor and a memory, while programming code is stored and on that memory and executable by a processor to perform designated functions.

A computing system, as used herein, may be, for example, a web-based server, a local area network server, a cloud-based server, a notebook computer, a desktop computer, an all-in-one system, a tablet computing device, a mobile phone, an electronic book reader, or any other electronic device suitable for provisioning a computing resource to perform a unified visualization interface. The computing system may include a processor and a computer-readable storage medium.

Figure 2:
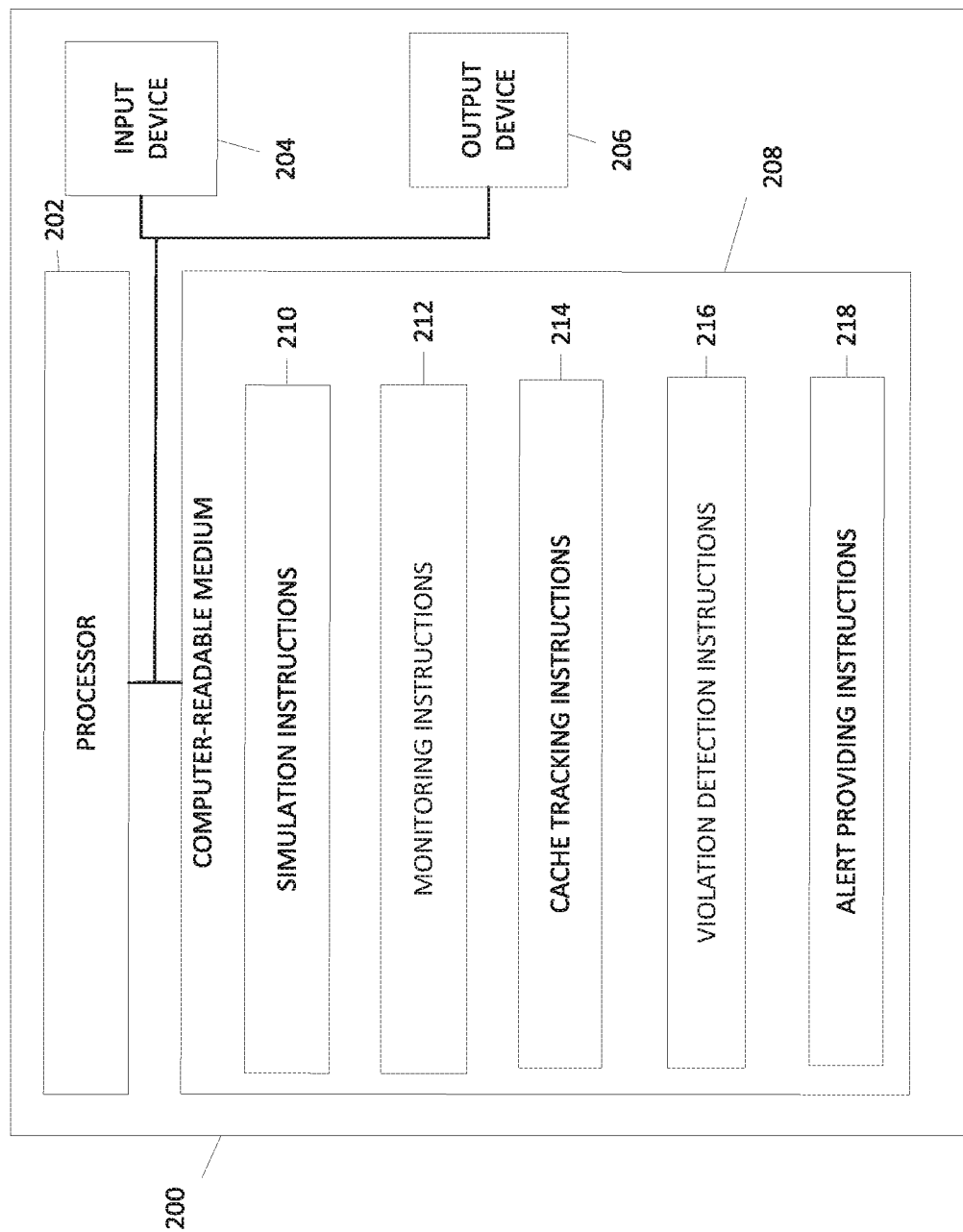
FIG. 2 is a block diagram illustrating one example of a computer readable medium for a simulator based detection of a violation of a coherency protocol in an incoherent shared memory system.

FIG. 2 is a block diagram illustrating one example of a computer readable medium for a simulator based detection of a violation of a coherency protocol in an incoherent shared memory system. Processing system 200 includes a processor 202, a computer readable medium 208, input device 204, and output device 206. Processor 202, computer readable medium 208, input device 204, and output device 206 are coupled to each other through a communication link (e.g., a bus).

Processor 202 executes instructions included in the computer readable medium 208. Computer readable medium 208 includes simulation instructions 210 to simulate, on a first computing system, a second computing system that is a target for an application to be tested.

Computer readable medium 208 includes monitoring instructions 212 to monitor a state of a plurality of simulated caches in an incoherent memory system shared by a plurality of simulated processors, wherein the plurality of simulated processors simulate operations of a respective plurality of processors of the second computing system.

Computer readable medium 208 includes cache tracking instructions 214 to track one of a flush state for a simulated cache associated with a simulated CPU performing a write operation, and a cache invalidation in a simulated CPU that is performing a read operation in the incoherent memory system.

Computer readable medium 208 includes violation detection instructions 216 to detect a violation of a coherency protocol in the shared memory system.

Computer readable medium 208 includes alert providing instructions 218 to provide, via a computing device on the first computing system, an alert indicative of the violation.

In some examples, computer readable medium 208 includes instructions to simulate each of the caches on the second computing system, determine, for each of the simulated caches, if a cache line is to be flushed, and flush the cache line upon a determination that the cache line is to be flushed.

Input device 204 includes a keyboard, mouse, data ports, and/or other suitable devices for inputting information into processing system 200. In some examples, input device 204 is used to receive, via a computing device, user interactions responsive to an alert. Output device 206 includes a monitor, speakers, data ports, and/or other suitable devices for outputting information from processing system 200. In some examples, output device 206 is used to provide, via a computing device, an alert indicative of a violation.

As used herein, a computer readable medium may be any electronic, magnetic, optical, or other physical storage apparatus to contain or store information such as executable instructions, data, and the like. For example, any computer readable storage medium described herein may be any of Random Access Memory (RAM), volatile memory, non-volatile memory, flash memory, a storage drive (e.g., a hard drive), a solid state drive, and the like, or a combination thereof. For example, the computer readable medium 208 can include one of or multiple different forms of memory including semiconductor memory devices such as dynamic or static random access memories (DRAMs or SRAMs), erasable and programmable read-only memories (EPROMs), electrically erasable and programmable read-only memories (EEPROMs) and flash memories; magnetic disks such as fixed, floppy and removable disks; other magnetic media including tape; optical media such as compact disks (CDs) or digital video disks (DVDs); or other types of storage devices.

Figure 3:
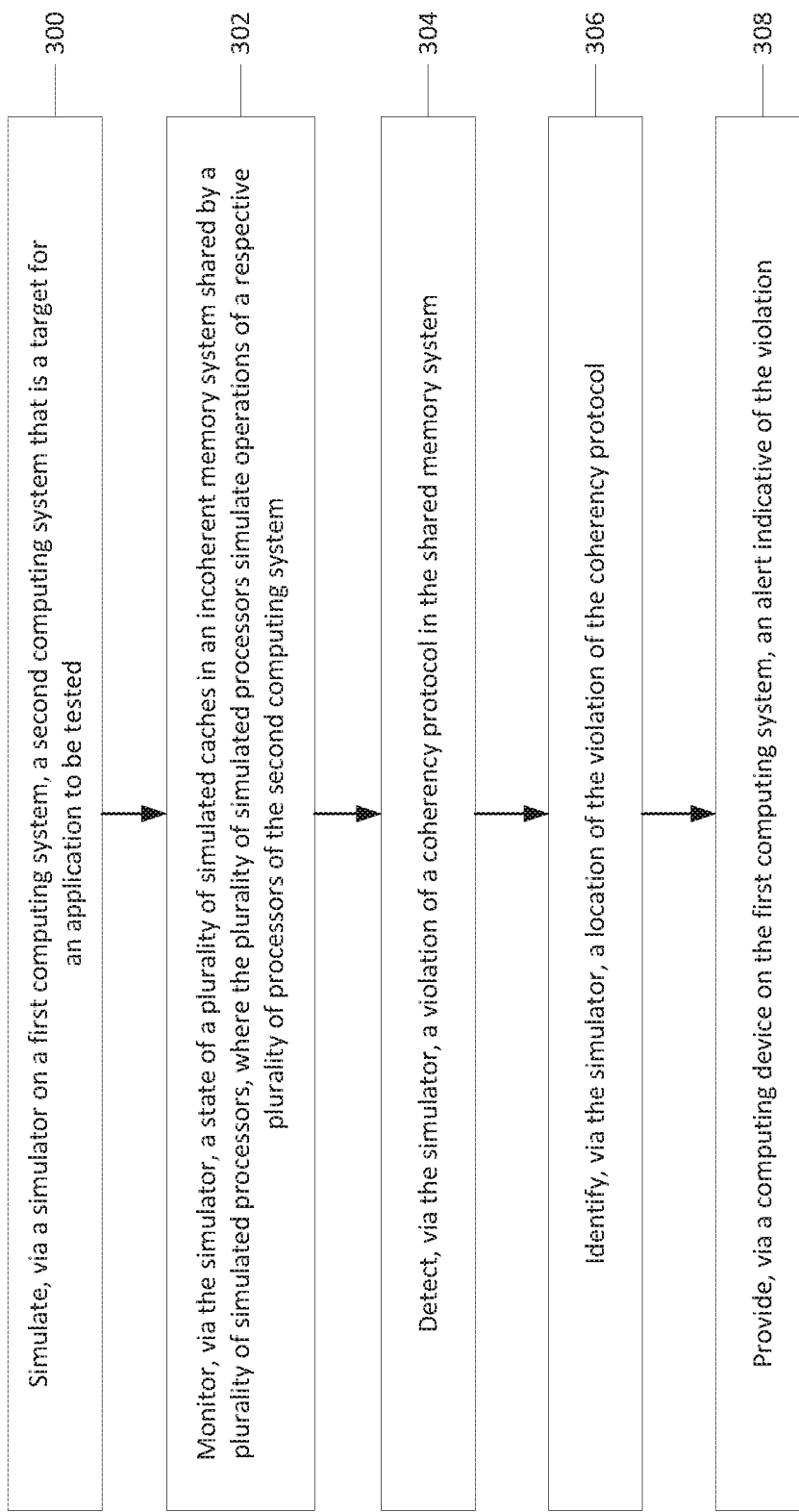
FIG. 3 is a flow diagram illustrating one example of a method for a simulator based detection of a violation of a coherency protocol in an incoherent shared memory system.

As described herein, various components of the processing system 200 are identified and refer to a combination of hardware and programming configured to perform a designated visualization function. As illustrated in FIG. 3, the programming may be processor executable instructions stored on tangible computer readable medium 208, and the hardware may include processor 202 for executing those instructions. Thus, computer readable medium 208 may store program instructions that, when executed by processor 202, implement the various components of the processing system 200.

Such computer readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

Computer readable medium 208 may be any of a number of memory components capable of storing instructions that can be executed by Processor 202. Computer readable medium 208 may be non-transitory in the sense that it does not encompass a transitory signal but instead is made up of one or more memory components configured to store the relevant instructions. Computer readable medium 208 may be implemented in a single device or distributed across devices. Likewise, processor 202 represents any number of processors capable of executing instructions stored by computer readable medium 208. Processor 202 may be integrated in a single device or distributed across devices. Further, computer readable medium 208 may be fully or partially integrated in the same device as processor 202 (as illustrated), or it may be separate but accessible to that device and processor 202. In some examples, computer readable medium 208 may be a machine-readable storage medium.

FIG. 3 is a flow diagram illustrating one example of a method for a simulator based detection of a violation of a coherency protocol in an incoherent shared memory system. In some examples, such an example method may be implemented by a system such as, for example, system 100 of FIG. 1.

At 300, a second computing system that is a target for an application to be tested is simulated via a simulator on a first computing system.

At 302, a state of a plurality of simulated caches in an incoherent memory system shared by a plurality of simulated processors is monitored, where the plurality of simulated processors simulate operations of a respective plurality of processors of the second computing system.

At 304, a violation of a coherency protocol in the shared memory system is detected via the simulator.

At 306, a location of the violation of the coherency protocol is identified.

At 308, an alert indicative of the violation is provided via a computing device on the first computing system.

Examples of the disclosure provide a generalized system for a simulator based detection of a violation of a coherency protocol in an incoherent shared memory system. The generalized system views cache states across all caches in an incoherent memory system. The generalized system has a global view of the state of each cache line in memory and can detect errors that are generally undetectable by an application that is being tested, but could manifest problems later in the execution of the application being tested. The generalized system disclosed herein may be automated as part of a test process for a software development strategy.

Although specific examples have been illustrated and described herein, a variety of alternate and/or equivalent implementations may be substituted for the specific examples shown and described without departing from the scope of the present disclosure. This application is intended to cover any adaptations or variations of the specific examples discussed herein.

The invention claimed is:

1. A system comprising:
a simulator running on a first computing system, wherein the simulator is to simulate a second computing system that is a target for an application to be tested, and wherein the simulator comprises:
a cache manager to:
monitor a state of a plurality of simulated caches in an incoherent memory system shared by a plurality of simulated processors, wherein the plurality of simulated processors simulate operations of a respective plurality of processors of the second computing system, and
detect a violation of a coherency protocol in the shared memory system; and
an alert generator to provide, via a computing device on the first computing system, an alert indicative of the violation.

2. The system of claim 1, wherein the cache manager is to track a flush state for a simulated cache associated with a simulated CPU performing a write operation.

3. The system of claim 1, wherein the cache manager is to track a cache invalidation in a simulated CPU that is performing a read operation in the incoherent memory system.

4. The system of claim 1, wherein the cache manager is to determine, for each of the plurality of simulated caches, if a cache line is to be flushed.

5. The system of claim 4, wherein, upon a determination that the cache line is to be flushed, the cache manager is to validate that the cache line is flushed.

6. The system of claim 1, wherein the violation comprises a first simulated processor of the plurality of simulated processors reading a cache line in a first simulated cache of the plurality of simulated caches prior to a write operation, while a second simulated processor of the plurality of simulated processors is modifying the cache line in the first simulated cache, and the cache manager is to detect the violation by checking the state of the first simulated cache when the cache line is read by the first simulated processor.

7. The system of claim 1, wherein the violation is an invalid cache line in a simulated cache of the plurality of simulated caches, and the cache manager is to detect the violation by checking the state of the simulated cache when the invalid cache line is read by a simulated processor of the plurality of simulated processors.

8. The system of claim 1, wherein the violation is a flush of a cache line by a second simulated processor subsequent to the cache line being read by a first simulated processor, and the cache manager is to detect the violation by identifying the first simulated processor when the cache line is flushed by the second simulated processor.

9. The system of claim 1, wherein the alert generator is to generate an alert to stop the simulation.

10. A method comprising:
   simulating, via a simulator on a first computing system, a second computing system that is a target for an application to be tested;
   monitoring, via the simulator, a state of a plurality of simulated caches in an incoherent memory system shared by a plurality of simulated processors, wherein the plurality of simulated processors simulate operations of a respective plurality of processors of the second computing system;
   detecting, via the simulator, a violation of a coherency protocol in the shared memory system;
   identifying, via the simulator, a location of the violation of the coherency protocol; and
   providing, via a computing device on the first computing system, an alert indicative of the violation.

11. The method of claim 10, wherein the violation comprises a first simulated processor of the plurality of simulated processors reading a cache line in a first simulated cache of the plurality of simulated caches prior to a write operation, while a second simulated processor of the plurality of processors is modifying the cache line in the first simulated cache, and comprising detecting the violation by checking, via the simulator, the state of the first simulated cache when the cache line is read by the first simulated processor.

12. The method of claim 10, wherein the violation is an invalid cache line in a simulated cache of the plurality of simulated caches, and comprising detecting the violation by checking, via the simulator, the state of the simulated cache when the invalid cache line is read by a simulated processor of the plurality of simulated processors.

13. The method of claim 10, wherein the violation is a flush of a cache line by a second simulated processor subsequent to the cache line being read by a first simulated processor, and comprising detecting the violation by identifying the first simulated processor when the cache line is flushed by the second simulated processor.

14. A non-transitory computer readable medium comprising executable instructions for a simulator to:
   simulate, on a first computing system, a second computing system that is a target for an application to be tested;
   monitor a state of a plurality of simulated caches in an incoherent memory system shared by a plurality of simulated processors, wherein the plurality of simulated processors simulate operations of a respective plurality of processors of the second computing system;
   track one of a flush state for a simulated cache associated with a simulated CPU performing a write operation, and a cache invalidation in a simulated CPU that is performing a read operation in the incoherent memory system;
   detect a violation of a coherency protocol in the shared memory system; and
   provide, via a computing device on the first computing system, an alert indicative of the violation.

15. The computer readable medium of claim 14, comprising instructions to:
   determine, for each of the simulated caches, if a cache line is to be flushed; and
   validate that the cache line is flushed upon a determination that the cache line is to be flushed.

* * * * *